US008322803B2

(12) United States Patent
Guzzo, Jr. et al.

(10) Patent No.: US 8,322,803 B2
(45) Date of Patent: Dec. 4, 2012

(54) FIBER DISTRIBUTION CABINET

(75) Inventors: Louis J. Guzzo, Jr., Inman, SC (US);
Philip Turner, Greenville, SC (US);
Wilfred Courchaine, Moore, SC (US);
Anthony L. Nieves, Fountain Inn, SC (US)

(73) Assignee: AFL Telecommunications, LLC, Spartansburg, SC (US)

( * ) Notice: Subject to any disclaimer, the term of this patent is extended or adjusted under 35 U.S.C. 154(b) by 38 days.

(21) Appl. No.: 11/842,666

(22) Filed: Aug. 21, 2007

(65) Prior Publication Data

US 2008/0042535 A1    Feb. 21, 2008

Related U.S. Application Data

(60) Provisional application No. 60/838,895, filed on Aug. 21, 2006.

(51) Int. Cl.
*A47B 81/00* (2006.01)
(52) U.S. Cl. .......................... 312/289; 312/283; 385/135
(58) Field of Classification Search .................. 312/283, 312/285, 289, 290, 257.1, 131, 132, 133, 312/302, 307, 248, 296, 310; 211/96–102, 211/172, 173, 189; 292/DIG. 15, DIG. 19, 292/288; 190/16, 19
See application file for complete search history.

(56) References Cited

U.S. PATENT DOCUMENTS

| | | | | | |
|---|---|---|---|---|---|
| 122,337 | A | * | 1/1872 | Thompson | 312/224 |
| 694,312 | A | * | 2/1902 | Barber | 312/289 |
| 710,009 | A | * | 9/1902 | Robertson | 312/274 |
| 757,003 | A | * | 4/1904 | Wilcox | 312/289 |
| 1,012,606 | A | * | 12/1911 | Davis | 190/16 |
| 1,187,356 | A | * | 6/1916 | Marbach | 312/290 |
| 1,396,624 | A | * | 11/1921 | Clark | 312/276 |
| 1,471,757 | A | * | 10/1923 | Thiriot | 312/208.4 |
| 1,620,047 | A | * | 3/1927 | Van Valkenburg | 174/59 |
| 1,932,045 | A | * | 10/1933 | Olson | 312/289 |
| 2,852,030 | A | * | 9/1958 | Nord | 134/179 |
| 2,987,846 | A | * | 6/1961 | Powell | 43/57.1 |
| 3,814,220 | A | * | 6/1974 | Brody | 190/19 |
| 4,775,200 | A | * | 10/1988 | Sheu | 312/229 |
| 5,232,277 | A | * | 8/1993 | Cassady et al. | 312/296 |
| 5,299,098 | A | | 3/1994 | Schussler et al. | |
| 5,694,232 | A | | 12/1997 | Parsay et al. | |
| 5,734,775 | A | | 3/1998 | Vidacovich et al. | |
| 5,781,410 | A | | 7/1998 | Keown et al. | |
| 5,911,661 | A | * | 6/1999 | Murray et al. | 52/220.6 |
| 6,170,928 | B1 | * | 1/2001 | Eardley et al. | 312/223.1 |

(Continued)

FOREIGN PATENT DOCUMENTS

EP    1 260 843 A1    11/2002

(Continued)

OTHER PUBLICATIONS

OmniReach FTTX Solutions FDH 3000, ADC, Mar. 2006, pp. 1-11.

(Continued)

*Primary Examiner* — James O Hansen
(74) *Attorney, Agent, or Firm* — Sughrue Mion, PLLC

(57) ABSTRACT

Provided is a cabinet including an outer shell having a plurality of doors, disposed such that edges of the plurality of doors form a corner of the outer shell when the doors are in a closed position; wherein, if the doors are open, continuous access is obtained to a plurality of working surfaces.

17 Claims, 6 Drawing Sheets

U.S. PATENT DOCUMENTS

| | | | |
|---|---|---|---|
| 6,467,640 B1 * | 10/2002 | Hung | 220/4.02 |
| 6,580,728 B1 | 6/2003 | Cook et al. | |
| 6,603,660 B1 * | 8/2003 | Ehn et al. | 361/694 |
| 6,792,190 B2 | 9/2004 | Xin et al. | |
| 6,792,191 B1 * | 9/2004 | Clapp et al. | 385/135 |
| 7,200,317 B2 | 4/2007 | Reagan et al. | |
| 7,233,731 B2 | 6/2007 | Solheid et al. | |
| 7,277,620 B2 | 10/2007 | Vongseng et al. | |
| 2002/0181925 A1 | 12/2002 | Hodge et al. | |
| 2003/0212999 A1 | 11/2003 | Cai | |
| 2004/0001686 A1 | 1/2004 | Smith et al. | |
| 2004/0228598 A1 * | 11/2004 | Allen et al. | 385/135 |

FOREIGN PATENT DOCUMENTS

| | | |
|---|---|---|
| WO | 03/024029 A2 | 3/2003 |
| WO | 03/056820 A1 | 7/2003 |

OTHER PUBLICATIONS

OmniReach FTTX Solutions FDH 3000-96 Terminations, ADC, Nov. 2006, pp. 1-6.

OmniReach FTTP Solutions Fiber Distribution Terminals, ADC, Apr. 2004, pp. 1-13.

Infrastructure Solutions for FTTX-PON Applications, ADC, Oct. 2003, pp. 1-4.

Optitect premier Local Convergence Cabinet, Corning Cable Systems, Sep. 2006, pp. 1-6.

Optitech Premier Local Convergence Cabinet, Corning Cable Systems, Jun. 2005, pp. 1-6.

Optitech Premier Cabinet (FDH-HDF), Corning Cable Systems, Sep. 2004, pp. 1-6.

Corning Cable Systems Evolant Solutions for Access Networks Outside Plant FiberOptic Hardware and Equipment for FTTx Networks, Nov. 2004, pp. 1-6.

Outdoor Fiber Distribution Hub—II, FONS, 2005, pp. 1-5.

Outdoor Fiber Distribution Hubs, FONS, 2005, pp. 1-4.

FTTP Solutions The Fiber Scalability Center OSP Cabinets, APA Cables & Networks, undated, pp. 1-6.

FibrBoss CSX216 and CSX432, Tyco Electronics, undated, pp. 1-15.

Taking a Personalized Approach to Cables & Networks, APA Cables & Networks, 2004, pp. 1-30.

FTTx Oribital (Fiber Distribution Cabinet) FDC 576), OFS, undated, pp. 1-2.

CSX-2 Outdoor Centralized Splitter Cabinet, Tyco Electronics, 2005, pp. 1-2.

Optical Cross Connection Cabinet with Splitter, Sunsea, undated, pp. 1-2.

FTTH Quick Reference Product Guide, Tyco Electronics, 2003, pp. 1-8.

U.S. Appl. No. 11/842,690, filed Aug. 21, 2007 by Louis J. Guzzo, Jr. et al.

"OmniReach FTTX Solutions Outdoor FDH 3000" ADC Telecommunciations, Inc. 102496AE 7/08, Revision 2008, 2007, pp. 1-20.

* cited by examiner

FIBER DISTRIBUTION CABINET

CROSS REFERENCE TO RELATED APPLICATION

This application claims priority under 35 U.S.C. §119(e) from U.S. Provisional Application No. 60/838,895 filed on Aug. 21, 2006, the disclosure of which is incorporated herein by reference in its entirety.

BACKGROUND OF THE INVENTION

1. Field of the Invention

Apparatuses consistent with the present invention relate to an apparatus for housing optical splitters that link feeder cables to consumer distribution cables. Specifically, the cabinet design may house splitters, but may also be used in a patch panel application, etc.

2. Description of the Related Art

Current fiber distribution hubs feature a cabinet having a single door that is hinged from a side of the front of the cabinet. The placement of the hinge at a side of the front of the cabinet helps to minimize the necessary size of the cabinet. However, the same design also minimizes the working area inside the cabinet. In most cases, the working area for a worker is limited to the size of the opening of the door. Because the workspace is cramped, a worker may inadvertently contact existing working components. Thus, the risk of accidental fiber breakage causing a service outage significantly increases. Additionally, the cramped and confirming workspace contributes to longer installation times as more caution is needed when working with the existing cabinet.

Further, most existing hubs have distribution rack components with an inner working space that is concave in nature. Unfortunately, this concave shape also results in limited working space within the cabinet of the hub. A large majority of work done on the cabinet and distribution rack is done on the front side of the distribution rack. It is extremely difficult to perform the necessary work with the existing designs.

Most fiber distribution hubs are placed in outdoor environments. Thus, the cabinets of the hubs are exposed to a number of environmental factors, both human and weather related. These factors can result in the cabinet needing to be replaced due to damage. Current hubs do not provide an adequate way of removing the cabinet without interrupting service to customers. Replacing the cabinet is necessary as damaged cabinets should be replaced in order to properly protect the optical fibers contained within.

With regard to the interior workings of existing cabinets, rings and guides are often used to concentrate pigtails at discrete locations. However, as the pigtails enter and exit these locations, the rings and guides tend to cause the pigtails to become kinked and/or crossed. Further, as more pigtails are installed, the weight of the pigtails increases, and the rings and guides offer limited strain relief. Thus, the lateral and tensile stresses on the pigtails are increased, which leads to increased attenuation or fiber breakage. Additionally, as the pigtail group gets larger, the sag of the pigtail grouping increases. The increase in sag results in difficulty in accessing previously installed connectors, pigtails and cables.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

According to an aspect of the instant invention, there is provided a cabinet comprising an outer shell having a plurality of doors, disposed such that edges of the plurality of doors form a corner of the outer shell when the doors are in a closed position; wherein, if the doors are open, continuous access is obtained to a plurality of working surfaces.

According to another aspect of the instant invention, there is provided a rack comprising a plurality of connected arms, the plurality of arms having the ability to be fixed in a plurality of positions.

According to another aspect of the instant invention, there is provided a strain relief organization system comprising a plurality of slots which guide a plurality of optical fibers within a working surface, such that each of the plurality of optical fibers in a position remain substantially parallel along an axial direction of the plurality of optical fibers to the remaining plurality of optical fibers in another position; wherein a cushioning material is used to support the plurality of optical fibers and hold the plurality of fibers firmly in position within the slots as the plurality of optical fibers are routed within a cabinet.

According to another aspect of the instant invention, there is provided a strain relief organization system comprising a cushioning material disposed such that at least one optical fiber is supported and held securely as the at least one optical fiber is routed throughout a cabinet.

According to another aspect of the instant invention, there is provided a system for maintaining a position of a rack comprising a gravity fed latch which holds said rack in a position outside a cabinet and a position inside a cabinet, wherein, when the gravity fed latch is displaced in a direction, the rack is able to be pivoted.

According to another aspect of the instant invention, there is provided a cabinet comprising an outer shell; a fiber management rack which provides a plurality of connection points; and a floor comprising a removable piece; wherein if the removable piece is removed, the outer shell may be removed without disturbing the connections points.

According to another aspect of the instant invention, there is provided a cabinet comprising an outer shell comprising a plurality of doors; wherein an edge of one of the plurality of doors is formed to provide a column which provides structural support for the outer shell.

BRIEF DESCRIPTION OF THE DRAWINGS

The above and other aspects of the present invention will become apparent and more readily appreciated from the following description of the exemplary embodiments, taken in conjunction with the accompanying drawings of which.

DETAILED DESCRIPTION OF THE EXEMPLARY EMBODIMENTS

The instant invention will now be described more fully with reference to the accompanying drawings, in which a fiber distribution cabinet according to an exemplary embodiment is shown. Elements shown in multiple drawings will be numbered consistently throughout the drawings.

Figure 1:
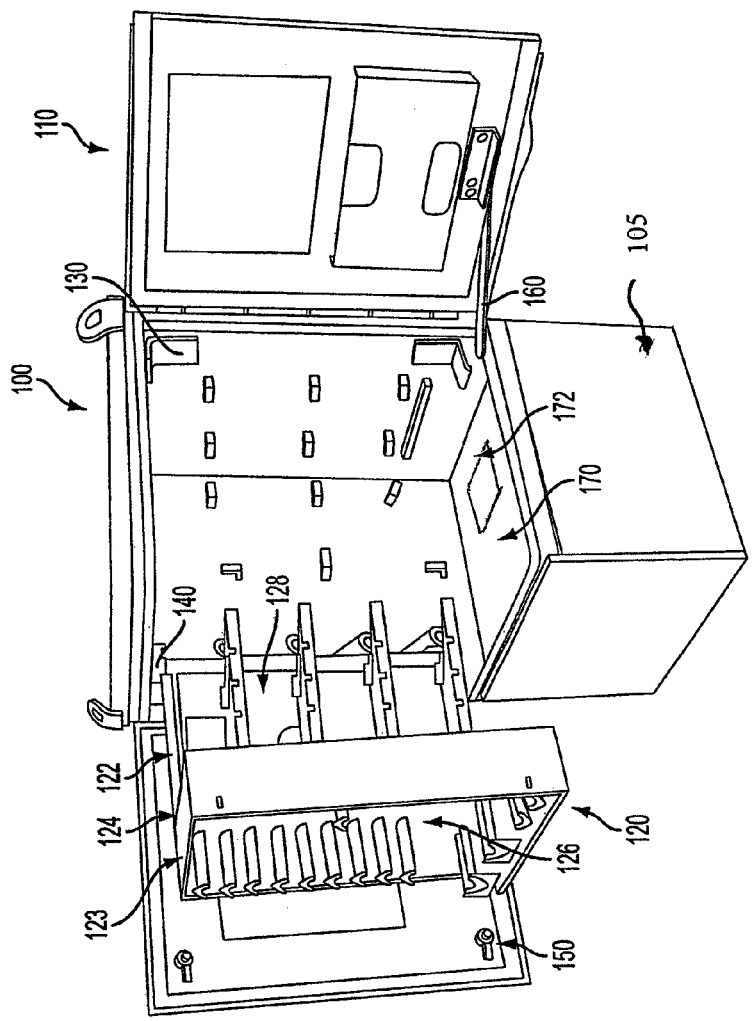
FIG. 1 shows a perspective view of a cabinet according to an exemplary embodiment of the instant invention.

FIG. 1 shows a perspective view of a cabinet according to an exemplary embodiment of the instant invention.

The cabinet 100 comprises a plurality of doors 110, a rack 120, a plurality of guides 130, a latch 140, a plurality of locking mechanisms 150 and a plurality of door latches 160.

As shown in FIG. 1, the plurality of doors 110 may be located at the corners of cabinet 100. By placing the plurality of doors 110 at direct opposite corners, the space inside cabinet 100 for a worker is maximized. The location of the doors also allows for a worker to access an exterior facing side (i.e., working surface) 126 of rack 120, and an interior facing side (i.e., working surface) 128 of rack 120. The interior walls of the cabinet are also accessible when the doors are open.

The plurality of doors may be locked in the open position by a plurality of door latches 160. The door latches may secure the door open at either a position which is at an angle of 90 degrees with a closed position or a position which is at an angle of 105 degrees with a closed position.

Further, a plurality of locking mechanisms 150 are attached to at least one of the plurality of doors 110 in order to fix the plurality of doors in a closed position 110. When the plurality of doors 110 are fixed in the closed position, the cabinet has a weather-proof seal 180.

Additionally, the plurality of doors 110 are formed such that the plurality of doors assists in providing structural support for the cabinet. The plurality of doors have a bent sections 112 which act as support beams for the cabinet, providing a structurally sound cabinet for housing connection points. See FIG. 5 and further description below.

The cabinet also contains a floor 170, in which a removable piece may be incorporated. See FIG. 4. If the removable piece is removed from the floor 170, an outer shell 105 of the cabinet may be removed and replaced without disturbing the connections made at the connection points. That is, the outer shell 105 of the cabinet may be replaced without interrupting service to customers.

The rack 120 comprises a plurality of arms 122 and 124. The arms 122 and 124 are connected to one another by a pivot point 123. This allows the arms 122 and 124 to move with respect to one another. The rack 120 is connected to the cabinet by a hinge, which allows the rack 120 to pivot from the inside of the cabinet 100 to the outside of the cabinet 100. FIG. 1 shows the rack 120 pivoted outside of the cabinet 100.

When the rack 120 is contained within the cabinet 100, the arms 122 and 124 are maintained at a right angle to one another. When the rack is pivoted outside the cabinet 100, the arm 124 may be positioned at an angle which is obtuse with respect to arm 122.

The rack 120 is held in place while within the cabinet 100 by a latch 140, which may be gravity fed. In order to pivot the rack 120 outside the cabinet 100, the latch 140 is vertically displaced, while the rack 120 is pivoted around the hinge. When the rack 120 is disposed outside the cabinet, the latch 140 is released, and falls into a position, holding rack 120 in position outside the cabinet 100. In order to pivot the rack 120 back within the interior of cabinet 100, the latch 140 must again be displaced, and the rack 120 is pivoted around the hinge. Thus, the latch 140 is capable of locking the rack 120 at positions both within the cabinet 100 and outside the cabinet 100.

In addition to the hinge attached to arm 122, when the rack 120 is disposed within the cabinet 100, a plurality of guides 130 support the rack 120 and maintain the position of the rack 120 within the cabinet 100. These guides, along with the latch 140, work to lock the rack 120 in place when the rack 120 is positioned within the cabinet 100.

Figure 2:
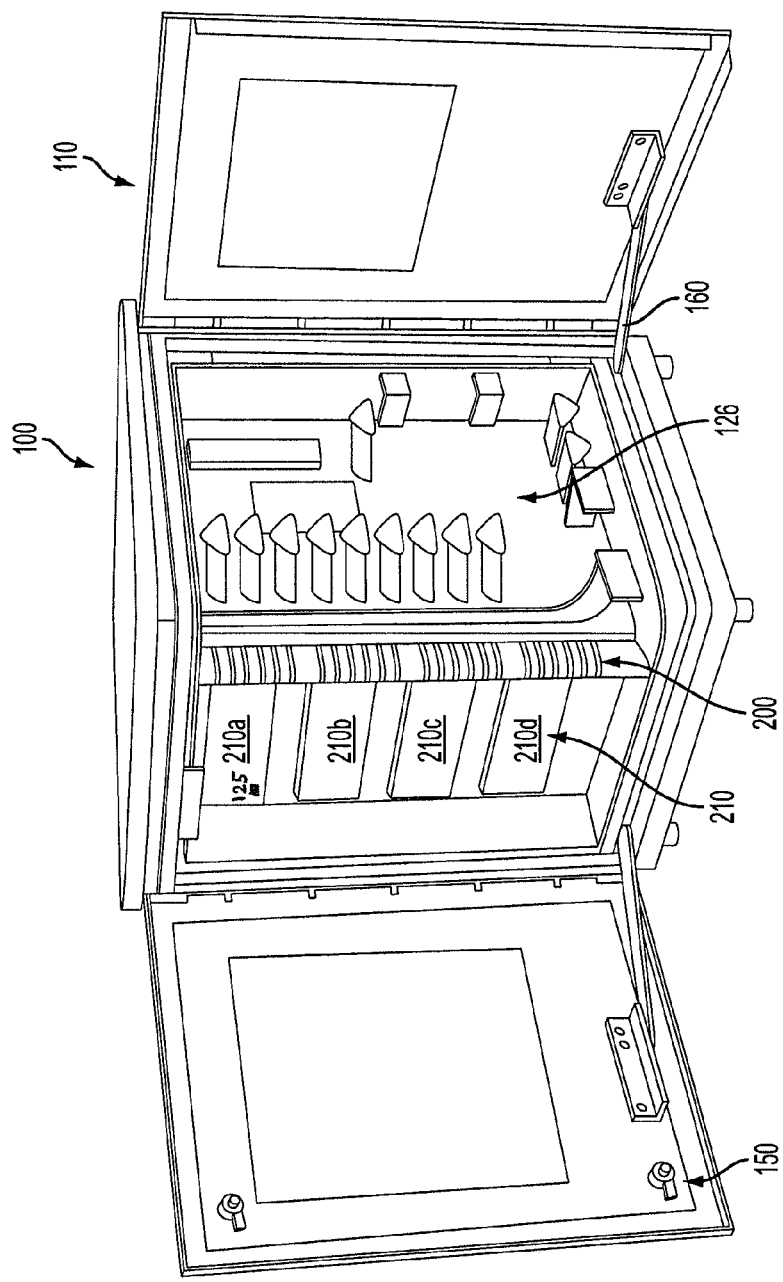
FIG. 2 is another perspective view of the cabinet according to an exemplary embodiment of the instant invention.

A plurality of connection points 125 are located on the rack 120 (See FIG. 2). These connection points allow for connections between optical fibers and pigtails.

FIG. 2 is another perspective view of the cabinet according to an exemplary embodiment of the instant invention.

As seen in FIG. 2, the rack 120 is maintained completely within the cabinet 100. The latch 140 is gravity fed in front of arm 122, in order to prevent the rack 120 from being able to pivot outside of the cabinet 100. When the rack 120 is held within the cabinet 100, a worker has access to working plane 126 and the exterior facing side of arm 122.

A series of slots 200 are located on one of the plurality of arms 122 and 124. The slots 200 guide each optical fiber within a horizontal row 210a-210d in a manner such that the optical fibers are disposed substantially parallel in the respective horizontal row.

A compressible material is shown within each of the series of slots 200. The compressible material comprises a single piece of compressible material having a plurality of openings cut into the material. The plurality cuts have top portion 302 and a bottom portion 303 (See FIG. 3), and secure each optical fiber passing through the series of slots 200 in a direction parallel to other optical fibers passing through the series of slots 200 along an axial direction of the plurality of optical fibers. The top and bottom portions prevent the optical fibers from becoming kinked and crossed. Further, sagging of the optical fibers is prevented, as the top and bottom portions provide support for the optical fibers.

Figure 3:
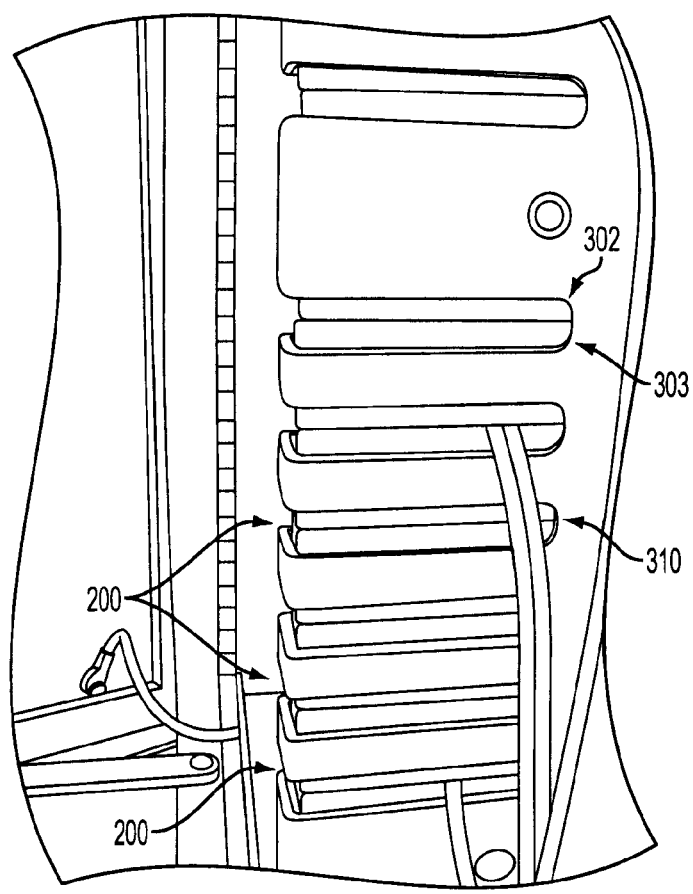
FIG. 3 is a magnified view of the slots shown in FIG. 2 according to an exemplary embodiment of the instant invention.

FIG. 3 is a magnified view of the slots 200 disposed on one of the plurality of arms 122 and 124. As noted above, the compressible material is disposed so as to have the openings be accessible through the series of slots 200, and to surround each of a plurality of optical fibers. The compressible material includes a top portion 302 and a bottom portion 303. Each of the optical fibers 310 passing through one of the plurality of slots 200 are maintained in a parallel position with respect to one another. Thus, the optical fibers 310 are not able to lay across one another, and the fibers can avoid being kinked.

Figure 4A:
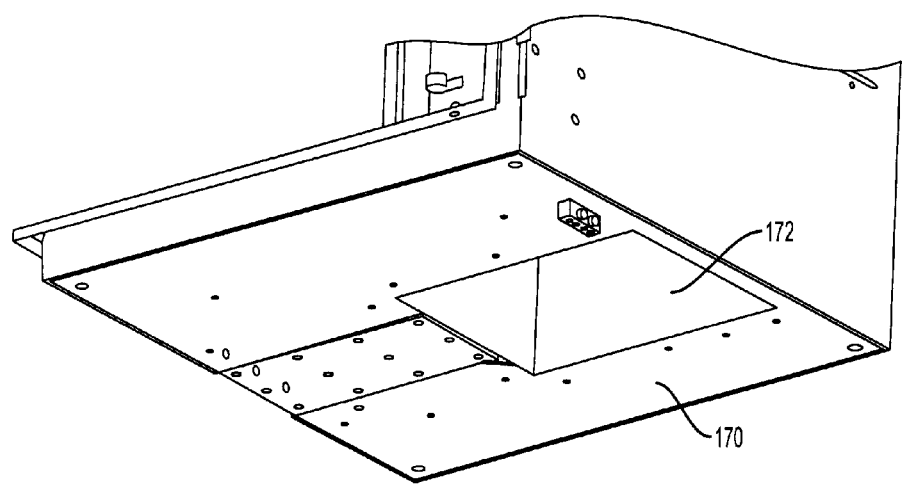
FIGS. 4A and 4B are perspective views showing an intact floor of the cabinet and a floor with a removable piece removed from the floor according to an exemplary embodiment of the instant invention.
Figure 4B:
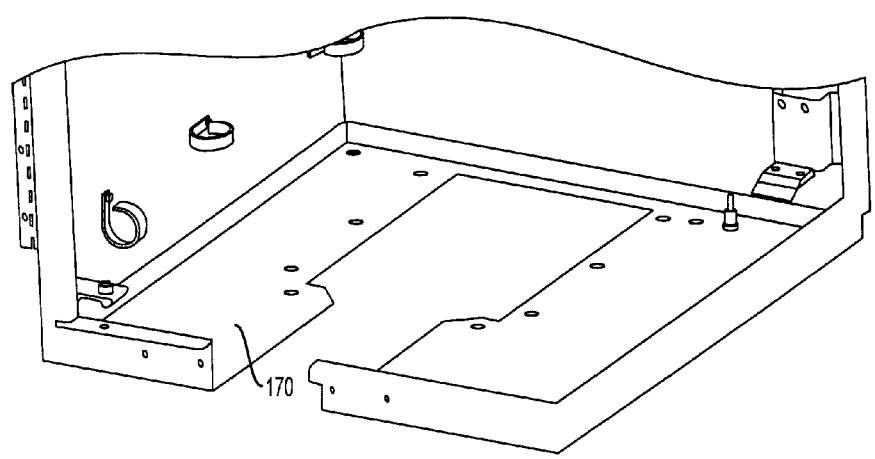

FIGS. 4A and 4B are perspective views showing an intact floor of the cabinet and a floor with a removable piece removed from the floor, respectively. During normal operation, the cabinet 100 is maintained with an intact floor 170. However, in the course of normal operation, portions of the cabinet may need to be replaced due to damage from weather, human factors, environmental factors, etc. Thus, the cabinet may be provided with a removable portion 172 disposed within the floor 170 of the cabinet 100. As seen in FIG. 4B, when the removable portion 172 is removed from the floor 170, an opening is formed in the floor 170. Thus, once the opening is formed by removing the removable portion 172, an outer shell of the cabinet may be removed and replaced without disturbing the optical fiber connections. Thus services provided to customers do not need be interrupted while replacement of the cabinet occurs.

Figure 5:
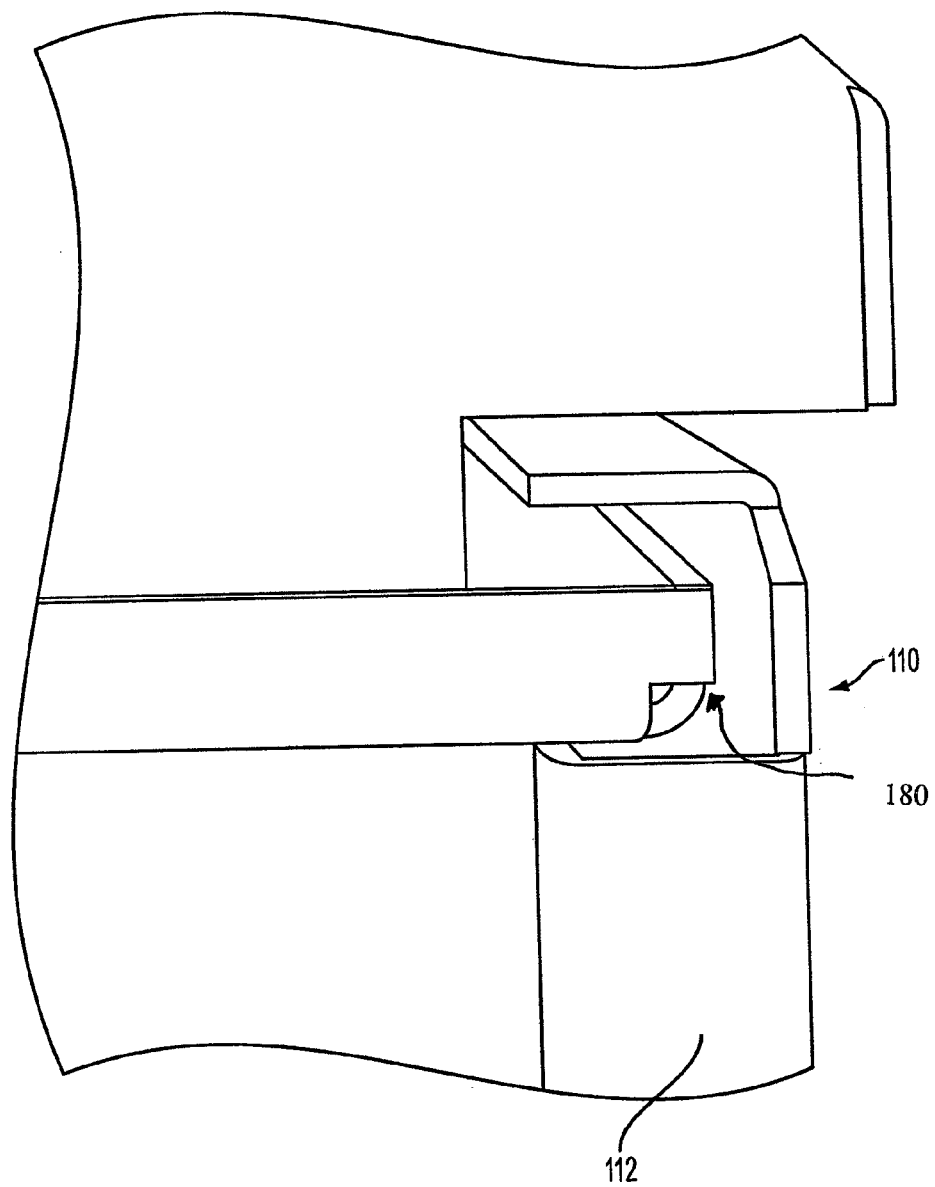
FIG. 5 is a magnified view of a reinforced column disposed as a portion of a door according to an exemplary embodiment of the instant invention.
Figure 6:
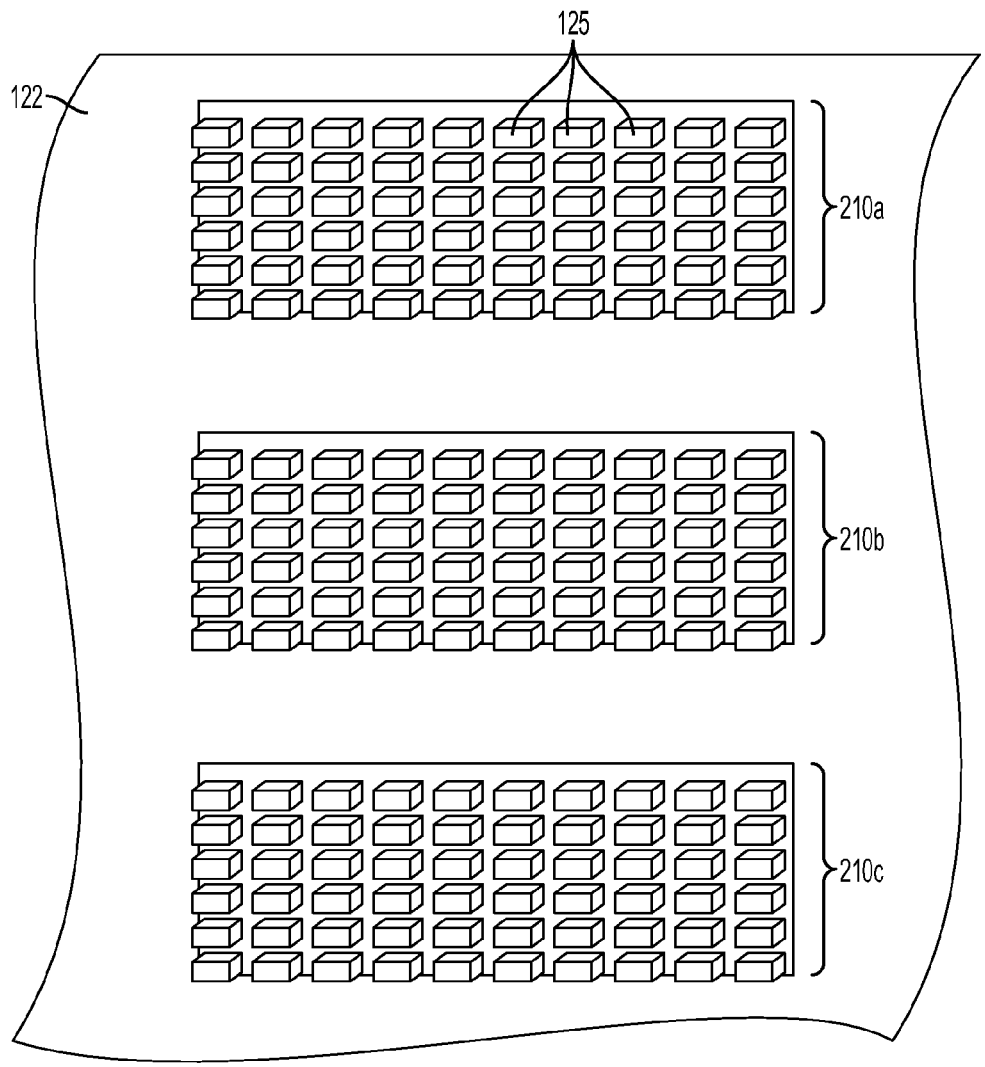
FIG. 6 is a magnified view of a front face of an arm of the rack, according to an exemplary embodiment of the instant invention.

FIG. 5 is a magnified view of a reinforced column disposed as a portion of a door according to an exemplary embodiment of the instant invention. If a large amount of weight is placed on the top of the cabinet 100, the top may push down, causing contact between the top of the cabinet 100 and the fiber distribution rack 120. In order to prevent further downward movement of the top, and the risk of damage to the rack 120, an edge 112 of one of the doors 110 may be reinforced as a structural column to assist in supporting the cabinet 100, as seen in FIG. 5. A gap of about 1/16" is typically maintained between the top of the cabinet 100 and the supporting column 112. However, if enough weight is placed atop the cabinet 100 to close the gap, the further flexing of the top of the cabinet 100 is prevented by the column 112. This prevents damage from occurring to the fiber distribution rack 120 by weight being placed atop the cabinet 110.

Although the exemplary embodiment of the present invention has been described, it will be understood by those skilled in the art that the present invention should not be limited to the described exemplary embodiment, but various changes and modifications can be made within the spirit and the scope of the present invention. Accordingly, the scope of the present invention is not limited to the described range of the following claims.

What is claimed is:

1. A cabinet comprising:
   an outer shell having a first door and a second door, disposed at opposite corners of the outer shell such that edges of the first and second doors form a corner of the outer shell when the doors are in a closed position;
   a fiber distribution rack comprising a first arm and a second arm;
   the first and second arms having the ability to be fixed in a plurality of positions, and a plurality of angles with respect to one another;
   a plurality of fiber optic connection points that connect optical fibers are disposed on the fiber distribution rack;
   wherein, when the first and second doors are in an open position, continuous access is obtained to the fiber distribution rack; and
   wherein, when the doors are in the closed position, the fiber distribution rack is disposed inside the outer shell, such that the first arm of the distribution rack is parallel to the first door and the second arm of the distribution rack is parallel to the second door.

2. The cabinet as claimed in claim 1, further comprising a plurality of door latches, wherein at least one door latch of the plurality of door latches is paired to each of the first and second doors, and wherein each door latch locks each door in a plurality of open positions.

3. The cabinet as claimed in claim 2, wherein each of the first and second doors is locked in an open position which is at an angle of 90° with a closed position of each of the first and second doors.

4. The cabinet as claimed in claim 2, wherein each of the first and second doors is locked in an open position which is at an angle less than 90° with a closed position of each of the first and second doors.

5. The cabinet as claimed in claim 2, wherein each of the first and second doors is locked in an open position which is at an angle greater than 90° but less than 180° with a closed position of each of the first and second doors.

6. The cabinet as claimed in claim 5, wherein a latch maintains a position of the first and second arms with respect to the outer shell.

7. The cabinet as claimed in claim 1, further comprising a plurality of guides which maintain the position of the first and second arms when the first and second arms are completely maintained within the outer shell.

8. The cabinet as claimed in claim 1, wherein the first and second arms are hinged at a corner of the outer shell.

9. The cabinet as claimed in claim 8, wherein guides are disposed at an opposite corner to the hinged corner of the first and second arms.

10. The cabinet as claimed in claim 1, wherein the first and second doors comprise a seal, such that the cabinet is provided with a weather-proof seal when the first and second doors are closed.

11. The cabinet as claimed in claim 1, further comprising:
    a floor comprising a removable piece;
    wherein if the removable piece is removed, the outer shell may be removed without disturbing the connections points within the cabinet.

12. The cabinet as claimed in claim 1, wherein an edge of one of the first and second doors is formed to provide a column which provides structural support for the outer shell.

13. The cabinet as claimed in claim 1,
    wherein an outer edge of one of the first and second doors is formed to provide a column which provides structural support at a bottom surface of a top of the outer shell when weight is applied to the top of the outer shell when the one door is in a closed position.

14. The cabinet as claimed in claim 1, wherein at least one of the first and second arms comprises one or more slots that guide the optical fibers to be connected to the connection points.

15. The cabinet as claimed in claim 14, wherein the one or more slots are disposed at a pivot point where the first and second arms are connected.

16. The cabinet as claimed in claim 14, wherein the one or more slots comprise a top portion and a bottom portion through which the optical fibers pass.

17. The cabinet as claimed in claim 16, wherein at least one of the top portion and the bottom portion are made of a compressible material.

* * * * *